United States Patent
Youn et al.

(10) Patent No.: US 9,085,717 B2
(45) Date of Patent: Jul. 21, 2015

(54) ADHESIVE MATERIAL FOR ELECTRIC CONNECTION, DISPLAY DEVICE USING THE ADHESIVE MATERIAL AND METHOD OF FABRICATING THE DISPLAY DEVICE

(71) Applicant: LG Display Co., Ltd., Seoul (KR)

(72) Inventors: Yeo-O Youn, Gwangju (KR); Dong-Sik Park, Seoul (KR); Jeong-Beom Park, Gunpo-si (KR); Hye-Sun Song, Pocheon-si (KR); A-Ram Sohn, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/091,552

(22) Filed: Nov. 27, 2013

(65) Prior Publication Data
US 2014/0153208 A1   Jun. 5, 2014

(30) Foreign Application Priority Data

Nov. 30, 2012 (KR) ........................ 10-2012-0138221

(51) Int. Cl.
| | | |
|---|---|---|
| B29C 71/04 | (2006.01) | |
| C08F 2/46 | (2006.01) | |
| A61L 2/08 | (2006.01) | |
| A61L 24/00 | (2006.01) | |
| C08G 61/04 | (2006.01) | |
| C09J 9/02 | (2006.01) | |
| H05K 7/06 | (2006.01) | |
| H05K 13/00 | (2006.01) | |
| C09J 11/00 | (2006.01) | |
| H01L 23/00 | (2006.01) | |
| C09J 133/04 | (2006.01) | |
| G02F 1/1345 | (2006.01) | |
| C08K 3/00 | (2006.01) | |
| C08K 3/16 | (2006.01) | |
| C08K 7/18 | (2006.01) | |
| C08K 3/08 | (2006.01) | |
| C08K 3/38 | (2006.01) | |

(52) U.S. Cl.
CPC .. *C09J 9/02* (2013.01); *C09J 11/00* (2013.01); *C09J 133/04* (2013.01); *G02F 1/13452* (2013.01); *H01L 24/83* (2013.01); *H05K 7/06* (2013.01); *H05K 13/00* (2013.01); *C08K 3/0016* (2013.01); *C08K 3/16* (2013.01); *C08K 7/18* (2013.01); *C08K 2003/0806* (2013.01); *C08K 2003/387* (2013.01); *C08K 2201/001* (2013.01); *H01L 2224/83192* (2013.01); *H01L 2924/07811* (2013.01); *H01L 2924/12041* (2013.01)

(58) Field of Classification Search
CPC ............ C09J 9/02; C09J 11/00; H05K 13/00; H05K 7/06; H01L 24/83; H01L 2924/12041; H01L 2924/07811; H01L 2924/00; H01L 2224/93192; C08K 3/16; C08K 2003/0806; C08K 2201/001; C08K 3/0016; C08K 7/18; C08K 2003/387
USPC .............................. 522/71, 1, 189, 184; 520/1
See application file for complete search history.

(56) References Cited

U.S. PATENT DOCUMENTS

| | | | |
|---|---|---|---|
| 5,393,697 A | 2/1995 | Chang et al. | |
| 6,592,783 B2 | 7/2003 | Kumakura et al. | |
| 2010/0304100 A1* | 12/2010 | Fong | 428/205 |
| 2014/0329926 A1* | 11/2014 | Kirino | 522/14 |

FOREIGN PATENT DOCUMENTS

JP        2013/089100    *  6/2013

OTHER PUBLICATIONS

Kyung-Woon Jang et al, Effects of Silica Filler and Diluent on Material Properties of Non-Conductive Pastes and Thermal Cycling Reliability of Flip Chip Assembly, Journal of the Microelectronics & Packaging Society, vol. 10, No. 3, pp. 1-9, 2003.
Pao-Yun Tang et al., 56.1: A Novel Composite Bump Design for Chip-on-Glass Package Using Non-Conductive Adhesive Film, SID 09 Digest, pp. 834-837, 2009.
Yi Li et al., Novel Nano-Scale Conductive Films With Enhanced Electrical Performance and Reliability for High Performance Fine Pitch Interconnect, IEEE Transactions on Advanced Packaging, vol. 32, No. 1, pp. 123-129, Feb. 2009.

* cited by examiner

*Primary Examiner* — Ling Choi
*Assistant Examiner* — Jessica E Whiteley
(74) *Attorney, Agent, or Firm* — McKenna Long & Aldridge LLP (57) ABSTRACT

The present invention provides an adhesive layer for an electrical connection. The adhesive layer includes a base resin; an ionic optical-curing agent; an optical curing accelerant; and a conductive particle having a size of several to several tens nanometers, wherein the adhesive layer is cured by a UV light, and the UV light is diffused by the optical curing accelerant.

18 Claims, 7 Drawing Sheets

ADHESIVE MATERIAL FOR ELECTRIC CONNECTION, DISPLAY DEVICE USING THE ADHESIVE MATERIAL AND METHOD OF FABRICATING THE DISPLAY DEVICE

CROSS-REFERENCE TO RELATED APPLICATIONS

The application claims the benefit of Korean Patent Application No. 10-2012-0138221 filed on Nov. 30, 2012, which is hereby incorporated by reference for all purposed as if fully set forth herein.

BACKGROUND OF THE INVENTION

1. Field of the Invention

The present invention relates to a display device. More particularly, the present invention relates to an adhesive material cured in a relatively low temperature and used as an electric connection, a display device using the adhesive material and a method of fabricating the display device.

2. Discussion of the Related Art

Recently, as society has entered in earnest upon an information age, a field of display devices that represent all sorts of electrical signals as visual images has developed rapidly. Flat panel display device, such as a liquid crystal display (LCD) device and an organic light emitting diode (OLED) device, having characteristic in thin profile, lightweight and low power consumption has been introduced.

Since the LCD device including a thin film transistor (TFT) as a switching element, referred to as an active matrix LCD (AM-LCD) device, has excellent characteristics of high resolution and displaying moving images, the AM-LCD device has been widely used.

On the other hand, since the OLED device has excellent characteristics of high brightness, a low power consumption and high contrast ratio, the OLED device has been widely used. Moreover, the OLED device has advantages such as a high response rate, and a low production cost.

Both the LCD device and the OLED device require an array substrate including a thin film transistor (TFT) as a switching element for control ON and OFF of each pixel region. In a non-display region of the array substrate, a printed circuit board (PCB) including a plurality of drive integrated circuit (IC) for driving elements of the array substrate is installed through a tape carrier package (TCP).

In more detail, in the non-display regions at an upper side and a left side of the array substrate, a gate pad electrode and a data pad electrode for electrical connection with an exterior circuit are respectively formed. In addition, a gate link line and a data link line respectively connecting to the gate pad electrode and the data pad electrode are formed.

In a display region of the array substrate, a gate line, which is connected to the gate pad electrode through the gate link line and extends along a horizontal direction, and a data line, which is connected to the data pad electrode through the data link line and extends along a vertical direction, are formed. The gate and data lines cross each other to define the pixel region. The TFT is formed at a crossing portion of the gate and data lines.

In the LCD device, a pixel electrode, which is connected to a drain electrode of the TFT, is formed in the pixel region. In addition, the LCD device includes a color filter substrate, where a color filter layer and a common electrode are formed, facing the array substrate. A liquid crystal layer is formed between the array substrate and the color filter substrate to form a liquid crystal panel of the LCD device.

On the other hand, in the OLED device, an organic emitting diode including an organic emitting layer is formed on the array substrate, and a counter substrate for encapsulation is disposed on the organic emitting diode.

As mentioned above, the PCB including the drive IC for driving the array substrate is installed on the array substrate. For example, the PCB is installed on the array substrate by a tape automated bonding process. As a result, the drive IC of the PCB is electrically connected to the gate pad electrode and the data pad electrode.

Figure 1A:
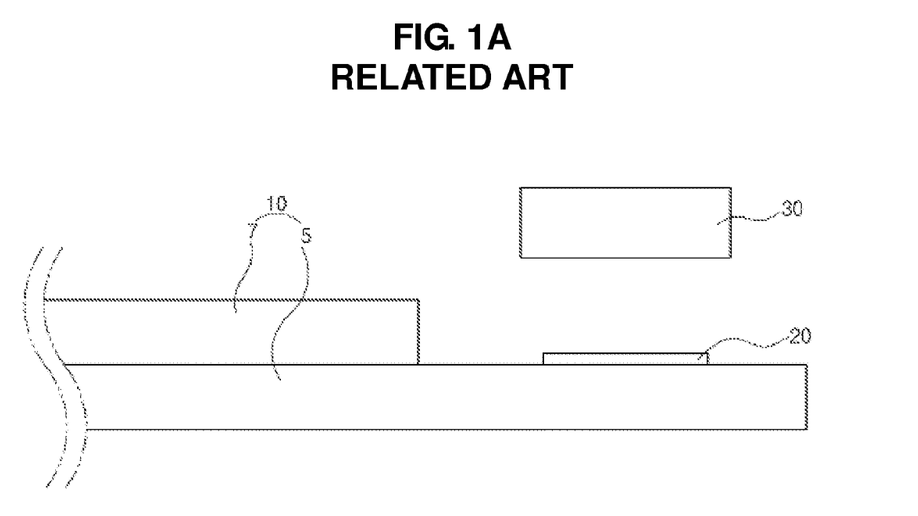
FIGS. 1A to 1C are cross-sectional views showing a conventional bonding process of the drive IC to the liquid crystal panel.
Figure 1B:
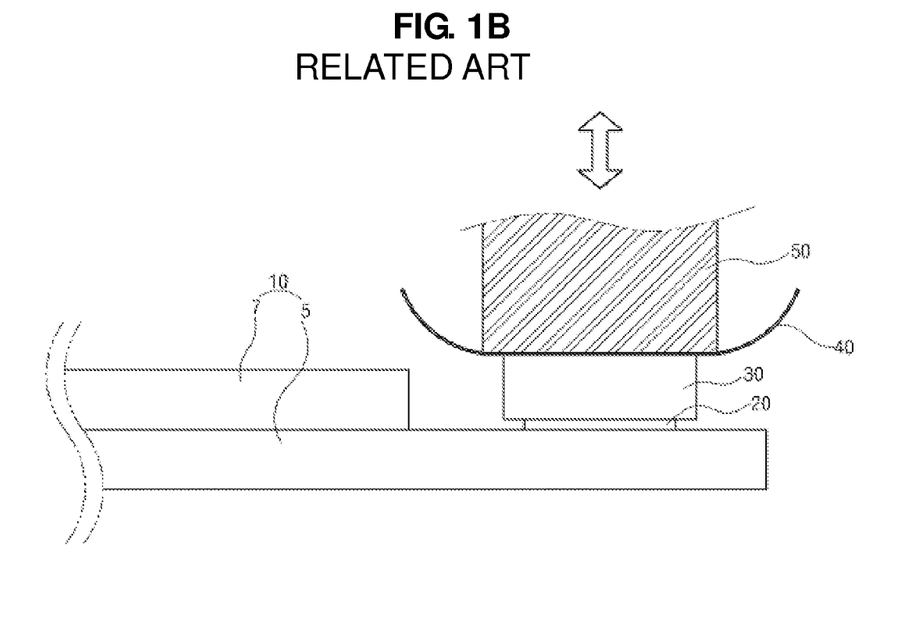
Figure 1C:
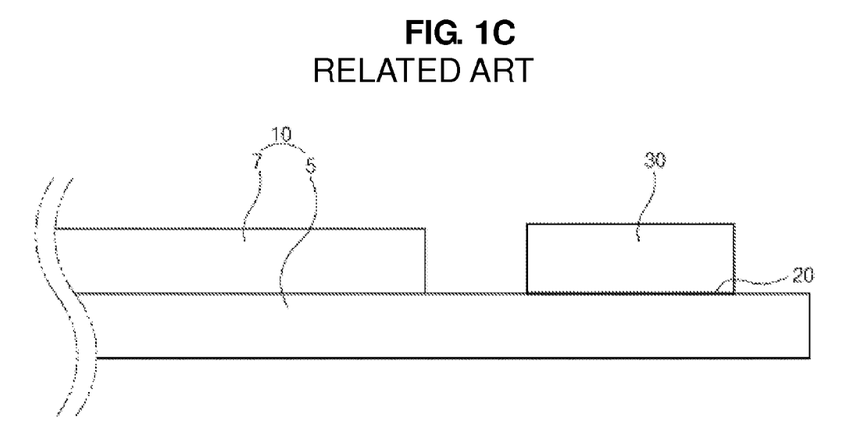

FIGS. 1A to 1C are cross-sectional views showing a conventional bonding process of the drive IC to the liquid crystal panel.

As shown in FIG. 1A, in the display device 10 including first and second substrates 5 and 7, an anistropic conductive film (ACF) 20 is disposed on a pad electrode (not shown) at the non-display region of the first substrate 5. The anistropic conductive film 20 includes conductive balls therein. The first substrate 5 may be the array substrate, and the pad electrode is the gate pad electrode or the data pad electrode. Next, the drive IC (30) is disposed over the anistropic conductive film 20.

Next, as shown in FIG. 1B, a thermal pressing unit 50 such as a heating bar is disposed on the drive IC 30 with a buffer film therebetween. The drive IC 30 is thermally pressed such that the pad electrode (not shown) and electrodes (not shown) in the drive IC 30 are electrically connected and adhered to each other by the anistropic conductive film 20 as shown in FIG. 1C.

However, in the thermal pressing process, there is a difference in a thermal expansion between the array substrate 5 and the drive IC 30. As a result, when the array substrate 5 and the drive IC 30 are cooled into a room temperature, there are warpage defects on the drive IC 30. These defects may be referred to as a smile defects.

In addition, there is a peeling process of the anisotropic conductive film such that the electrical connection between the drive IC and the pad electrode is destroyed.

On the other hand, requirement for the narrow bezel type display device, where the non-display region has a width of 0.5 to 2.0 mm, is increased. In the narrow bezel type display device, a polarization plate is formed on the color filter substrate may cover the pad electrode in the non-display region to increase ambient contrast ratio. In this instance, when the drive IC is installed on the array substrate by the above thermal pressing process, which is processed under a relatively high temperature of 150 to 190° C., the polarization plate may be damaged by heat in the thermal pressing process.

On the other hand, in a full HD display device, a distance between adjacent pad electrodes becomes narrowed. In this instance, when the drive IC and the pad electrode are connected using the anistropic conductive film 20, an electrical short problem between adjacent pad electrodes is generated.

SUMMARY OF THE INVENTION

Accordingly, the present invention is directed to an adhesive material for electrical connection and a display device using the adhesive material and a method of the display device that substantially obviate one or more of the problems due to limitations and disadvantages of the related art.

An object of the present invention is to provide an adhesive material for electrical connection being cured under a relatively low temperature.

Another object of the present invention is to provide an adhesive material for electrical connection being capable of preventing an electrical short between adjacent pad electrodes.

Another object of the present invention is to provide a display device using the adhesive material for electric connection and a method of the display device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, the present invention provides an adhesive material for electrical connection including a base resin; an ionic optical-curing agent; an optical curing accelerant; and a conductive particle having a size of several to several tens nanometers, wherein the adhesive film is cured by a UV light, and the UV light is diffused by the optical curing accelerant.

In another aspect, the present invention provides a display device includes a display panel including an array substrate and a color filter substrate; a pad electrode in a non-display region of the array substrate; an adhesive layer on the pad electrode and including: a base resin; an ionic optical-curing agent; an optical curing accelerant; and a conductive particle having a size of several to several tens nanometers, and a drive IC on the adhesive layer and electrically connected to the pad electrode through the adhesive layer, wherein the adhesive film is cured by a UV light, and the UV light is diffused by the optical curing accelerant.

In another aspect, the present invention provides a method of fabricating a display device including disposing a display panel including an array substrate and a color filter substrate, wherein a pad electrode is formed in a non-display region of the array substrate; forming ah adhesive layer on the pad electrode by coating an adhesive material, the adhesive material including: a base resin; an ionic optical-curing agent; an optical curing accelerant; and a conductive particle having a size of several to several tens nanometers, disposing a drive IC on the adhesive layer; irradiating a UV light onto the adhesive layer through a rear surface of the array substrate; and pressing the drive IC toward the adhesive layer, wherein the adhesive film is cured by a UV light, and the UV light is diffused by the optical curing accelerant, and wherein the UV light is diffused by the optical curing accelerant into a portion of the adhesive layer shielded by the pad electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to the preferred embodiments, examples of which are illustrated in the accompanying drawings.

Causes of the above peeling problem of the anisotropic conductive film may be various. For example, property change of the anistropic conductive film, such as decrease of the glass temperature (Tg) and the adhesion strength, increase of tensile stress, ion migration by corrosion, compressive stress by pressing, residual stress and decrease of interfacial property, may cause the peeling problem.

The strongest fact of the peeling problem may be the residual stress. After the array substrate and the drive IC are cooled, there is the shear stress in the anisotropic conductive film because of the thermal expansion difference among the pad electrodes, a bump of the drive IC and the drive IC. The residual stress is generated by the shear stress such that the mechanical adhesion between the electrode of the drive IC and the pad electrode of the array substrate is destroyed. As a result, a contact resistance is increased, and the anisotropic conductive film is peeled.

Hereinafter, the adhesive material being capable of preventing these problems is explained.

The adhesive material for electrical connection includes a base resin, an ion type curing agent, an optical curing accelerant and a conductive particle having a size of several to several tens nanometers.

The ionic optical-curing agent has a weight % of more than 0.01 and less than 10 with respect to a total amount of the adhesive material, and beneficially about 1 to 5 weight %. The optical curing accelerant has a weight % of more than 0.01 and less than 10 with respect to the total amount of the adhesive material, and beneficially about 1 to 5 weight %. The conductive particle has a weight % of about 0.1 to 1 with respect to the total amount of the adhesive material, and beneficially about 0.1 to 0.5 weight %. The base resin has a residual amount.

The related art anisotropic conductive film includes the conductive ball having a size of several to several tens micrometers, while the conductive particle has a size of several to several tens nanometers.

As mentioned above, when the related art anisotropic conductive film is used, there is the electrical short problem in the adjacent pad electrodes because the conductive balls have too large size, i.e., several to several tens micrometers. However, the size of the conductive particles of the conductive film in the present invention is sufficient small, i.e., several to several tens nanometers, such that the electrical short problem can be prevented.

In addition, in comparison to the adhesive film without conductive balls or conductive particles, the adhesive film has a relatively small thermal expansion difference between the adhesive film and each of the drive IC and the pad electrodes due to the conductive particles such that the peeling problem of the adhesive film can be sufficiently prevented. Moreover, even if the adhesive film is peeled, an electrical connection between the drive IC and the pad electrodes can be secured due to the conductive particles.

The adhesive material of the present invention includes the optical curing accelerant having light diffusing characteristics. Accordingly, a portion of the conductive film, where the UV is not directly irradiated, can be cured because of the light diffusion by the optical curing accelerant.

Moreover, the resin in the conductive film of the present invention has thermal curing characteristics. As a result, the conductive film of the present invention is cured by the UV as well as the heat such that the curing process time of the conductive film is reduced and can be performed under a relatively low temperature, e.g., about 110 to 130° C. Accordingly, the damages on the conductive film or the polarization plate can be prevented.

In the adhesive film of the present invention, the base resin includes at least one of epoxy resin and acrylate resin. For example, the epoxy resin may include naphthalene-based epoxy monomer, epoxyacrylate monomer, bisphenol-A-based epoxy monomer, bisphenol-F-based epoxy monomer, cresol-based epoxy monomer and novolak-based epoxy monomer. The acrylate resin may include 2-ethylhexylacrylate, tridecylmethacrylate, nonylphenolethoxylate monoacrylate, beta-carboxyethyl acrylate, isobornyl acrylate, tetrahydrofurfuryl acrylate, tetrahydrofurfuryl methacrylate, 4-butylcylcohexyl acrylate, dicyclopentenyl acrylate, dicycloentenyl oxyethyl acrylate, ethoxyethyl acrylate, and ethoxylated monoacrylate.

The ionic optical-curing agent includes at least one of borate salt and iodine salt.

The optical curing accelerant has a light diffusion property to accelerate the UV curing process and includes a light diffusion polymeric material. For example, the optical curing accelerant includes at least one of polystyrene (PS), polycarbonate (PC) and polyethyleneterephthalate (PET).

The optical curing accelerant may have a powder shape and has a refractive index larger than the material of the base resin to efficiently diffuse the UV light. For example, the refractive index of the optical curing accelerant may be above about 1.5. The powder-shaped optical curing accelerant may be a spherical shape or an amorphous shape.

The conductive particles having the size of several to several tens nanometers may be silver (Ag) particles.

As mentioned above, the adhesive film of the present invention is cured by the UV light. In addition, even if a portion of the adhesive film is shielded by an element of the array substrate such that the UV light is not directly irradiated onto the shielded portion of the adhesive film, the shielded portion of the adhesive film can be cured by the UV light due to the light diffusion property of the optical curing accelerant.

Moreover, the adhesive film of the present invention is cured by the heat. The shielded portion of the adhesive film is securely cured by the heat as well as the diffused UV light using the thermal pressing unit, e.g., the heating bar. The related art anisotropic conductive film should be cured by heating in the temperature of 150 to 190° C. However, in the present invention, the adhesive film is cured by both the UV light and the heat, the thermal curing process is performed using the thermal pressing unit with a relatively low temperature of about 110 to 130° C. As a result, damages or deformation on the adhesive film, the drive IC or the polarization plate can be prevented.

Figure 2:
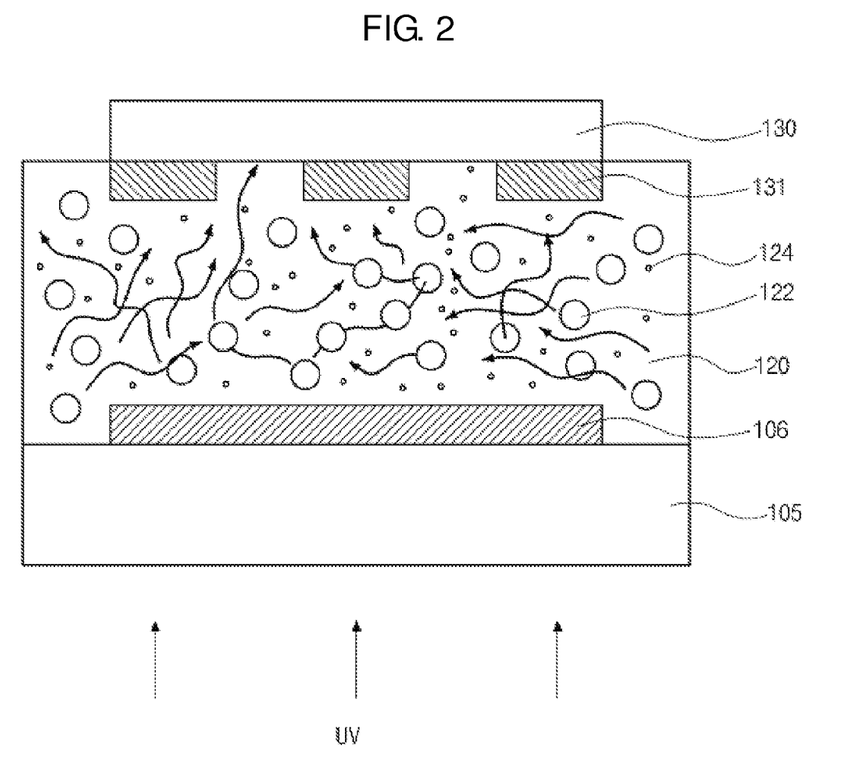
FIG. 2 is a perspective view illustrating a light diffusion principle in an adhesive material of the present invention.

FIG. 2 is a perspective view illustrating a light diffusion principle in an adhesive material of the present invention.

As shown in FIG. 2, when the drive IC 130 is bonded on the array substrate 105 of the display panel using the adhesive film 120, there is the pad electrode 106 on the array substrate 105 such that a portion, i.e., a center portion of the adhesive film 120, is shielded by the pad electrode 106. Namely, the portion of the adhesive film 120 is not exposed to the UV light being irradiated onto a rear surface of the array substrate 105.

However, since the adhesive film 120 includes the optical curing accelerant 122 having the light diffusion property, the UV light is diffused in the adhesive film 120 such that the shielded portion of the adhesive film 120 can be cured by the UV light.

In addition, the adhesive film 120 is further cured using the thermal pressing unit (not shown), which is pressed onto a front surface of the drive IC 130, such that the adhesive film 120 is efficiently cured with a relatively low temperature, i.e., about 110 to 130° C. In this instance, since the adhesive film 120 includes the conductive particles 124 having excellent heat conductive property, the thermal curing process is securely performed.

On the other hand, if the UV light irradiated onto the front surface of the drive IC 130, the UV light can be irradiated onto the central portion of the adhesive film 120 through a space of the electrodes 131 of the drive IC 130. However, in this instance, the thermal pressing unit (not shown) should be pressed onto the rear surface of the array substrate 105. The heat from the thermal pressing unit is blocked by the array substrate 105, e.g., glass substrate having a relatively low thermal conductivity, such that the thermal curing process can not be secured.

Consequently, in the present invention, the adhesive film 120 is cured by the UV light, which is irradiated onto the rear surface of the array substrate 105, and the heat, which is transferred through the top surface of the drive IC 130, such that the adhesive film 120 is efficiently cured with a relatively low temperature. In addition, since the adhesive film 120 includes the optical curing accelerant having the light diffusion property, an entire region of the adhesive film 120 can be cured by the UV light even if there are pad electrodes 106 on the array substrate 105. Moreover, since the adhesive film 120 includes the conductive particles, the adhesive film 120 can be efficiently cured by the heat due to the heat conduction by the conductive particles.

Hereinafter, properties of various adhesive films with or without the optical curing accelerant, according to a weight % of the ionic optical-curing agent, and according to a weight % of the conductive particle are tested.

An adhesive film including borate salt as the ionic optical-curing agent and polystyrene (PS) as the optical curing accelerant (Example 1), an adhesive film including iodine salt as the ionic optical-curing agent and PS as the optical curing accelerant (Example 2), an adhesive film including iodine salt as the ionic optical-curing agent without the optical curing accelerant (Comparative Example 1), an adhesive film including an imidazole-based thermal curing agent and PS without the ionic optical-curing agent (Comparative Example 2), and an adhesive film including an amine-based thermal curing agent and PS without the ionic optical-curing agent (Comparative Example 3) are prepared.

The adhesive films of the Examples 1 and 2 and the Comparative Examples 1 to 3 are cured using an LED lamp emitting the UV light of 400 mW/cm$^2$ and 365 nm wavelength and a thermal pressing unit providing the heat of 120° C. The curing process is performed for 5 seconds.

The testing results of the adhesive films are listed in Table 1.

TABLE 1

|  | Ex. 1 | Ex. 2 | Com. 1 | Com. 2 | Com. 3 |
| --- | --- | --- | --- | --- | --- |
| optical initiator | borate salt | iodine salt | — | — | — |
| thermal | — | — | — | Imidazole- | Amine- |

TABLE 1-continued

|  | | Ex. 1 | Ex. 2 | Com. 1 | Com. 2 | Com. 3 |
|---|---|---|---|---|---|---|
| curing agent | | | | | based initiator | based initiator |
| optical curing accelerant | | PS | PS | — | PS | PS |
| curing ratio (%) | optical curing | 85 | 73 | 68 | — | — |
| | thermal curing | 87 | 70 | 72 | 32 | 23 |
| curing depth (μm) | Optically-cured above 70% | 250 | 200 | 50 | — | — |

As shown in Table 1, since the adhesive films in the Examples 1 and 2 include the optical curing accelerant as well as the ionic optical-curing agent, the adhesive films have the optical curing ratio of 85% (Example 1) and 73% (Example 2) with the UV light.

However, since the adhesive films in the Comparative Examples 2 and 3 include the thermal curing agent without the optical initiator, the adhesive films are not cured by the UV light.

The adhesive films in the Examples 1 and 2 have the thermal curing ratio of 87% (Example 1) and 70% (Example 2) with the heat. However, the adhesive films in the Comparative Examples 2 and 3 have the thermal curing ratio of 32% (Comparative Example 1) and 23% (Comparative Example 2) with the heat such that the adhesive films are insufficiently cured.

On the other hand, the adhesive film in the Comparative Example 1 including the ionic optical-curing agent without the optical curing accelerant has the optical curing ratio of 68%. The light diffusion by the optical curing accelerant is not generated in the adhesive film in the Comparative Example 1 such that the shielded portion of the adhesive film by an element, i.e., the pad electrode, is not cured.

As a result, the adhesive films of the Examples 1 and 2 has the diffusion depth, which means a depth of the curing region, of 250 μm (Example 1) and 200 μm (Example 2), while the adhesive film of the Comparative Example 1 has the diffusion depth of 50 μm. The difference is caused from the light diffusion by the optical curing accelerant.

Adhesive films having different weight % of the ionic optical-curing agent (PS). (Example 3: 1 weight %, Example 4: 2 weight %, Example 5: 5 weight %, Comparative Example 4: 0.01 weight %, Comparative Example 5: 10 weight %) A curing ratio (%), a contact resistance (mΩ) and an adhesive force (die shear force, Kgf/cm$^2$) of the adhesive films are tested. The testing results are listed in Table 2. The driving condition is tested by driving the display device including the adhesive film under a temperature of 60° C. and a humidity of 90% for 500 hours.

TABLE 2

| | dimension | Com. 4 | Ex. 3 | Ex. 4 | Ex. 5 | Com. 5 |
|---|---|---|---|---|---|---|
| PS | wt % | 0.01 | 1 | 2 | 5 | 10 |
| curing ratio | % | 32 | 72 | 76 | 87 | 89 |
| contact resistance | mΩ | open | 1.21 | 1.26 | 1.26 | open |
| adhesive force | Kgf/cm$^2$ | 16 | 73 | 80 | 52 | 27 |
| driving condition | | line defects | OK | OK | OK | line defects |

As shown in Table 2, the adhesive films of the Examples 3 to 5 including the ionic optical-curing agent of 1 to 5 weight % have the curing ratio of 72% (Example 1), 76% (Example 2) and 87% (Example 3) and the contact resistance of 1.21 mΩ (Example 1) and 1.26 mΩ (Examples 2 and 3).

In addition, the adhesive films of the Examples 3 to 5 have the adhesive force of 73 Kgf/cm$^2$ (Example 1), 80 Kgf/cm$^2$ (Example 2) and 52 Kgf/cm$^2$ (Example 3) larger than a lower limitation requirement (30 Kgf/cm$^2$). Moreover, there is no problem of the driving condition in the display device including the adhesive films of the Examples 3 to 5.

However, the adhesive film of the Comparative Example 4 has too low curing ratio (32%). It is smaller than a lower limitation requirement of 70%.

In addition, the adhesive films of the Comparative Examples 4 and 5 have too low adhesive force of 16 Kgf/cm$^2$ (Comparative Example 4) and 27 Kgf/cm$^2$ (Comparative Example 5) smaller than the lower limitation requirement (30 Kgf/cm$^2$). Moreover, the line defects are generated in the display device including the adhesive films of the Comparative Examples 4 and 5 after 24 hours (Comparative Example 4) and 125 hours (Comparative Example 5).

Consequently, when the ionic optical-curing agent in the adhesive film is too small (Comparative Example 4), the curing ratio of the adhesive film is too low (lower than 70%) such that there are problems in the contact resistance and the adhesive force. As a result, there are problems in the driving condition, i.e., the line defects, in the display device including the adhesive film.

On the other hand, when the ionic optical-curing agent in the adhesive film is too large (Comparative Example 5), the adhesive film is over-cured to be brittle. As a result, there are problems in the driving condition, i.e., the line defects, in the display device including the adhesive film by cracks or an outer impact.

Adhesive films having different weight % of the conductive particle (Ag). (Example 6: 0.1 weight %, Example 7: 0.2 weight %, Example 8: 0.5 weight %, Example 9: 1.0 weight %, Example 10: 2.0 weight %, Example 11: 4.0 weight %, Comparative Example 6: 5.0 weight %) The testing results are listed in Table 3. In Table 3, the "spec" means a lower limitation requirement, and the "curing time" is a process time for curing the adhesive film into a reference curing ratio. The driving reliability is tested with the display device including the adhesive film by driving the display device under a temperature of 60° C. and a humidity of 90% for 500 hours. The driving reliability is tested whether a line dim defect is generated in a display region or not.

TABLE 3

| | | spec | Ex. 6 | Ex. 7 | Ex. 8 | Ex. 9 | Ex. 10 | Ex. 11 | Com. 6 |
|---|---|---|---|---|---|---|---|---|---|
| Ag | wt % | | 0.1 | 0.2 | 0.5 | 1.0 | 2.0 | 4.0 | 5.0 |
| dispersibility | | OK | OK | OK | OK | OK | OK | OK | OK |
| viscosity (@RT) | cP | 10,000 ± 1,500 | 9,850 | 9,970 | 11,500 | 13,500 | 14,200 | 17,450 | 19,400 |

TABLE 3-continued

|  |  | spec | Ex. 6 | Ex. 7 | Ex. 8 | Ex. 9 | Ex. 10 | Ex. 11 | Com. 6 |
|---|---|---|---|---|---|---|---|---|---|
| curing time (@120° C.) | sec | <6 | 5 | 5 | 5 | 6 | 7 | 8 | 9 |
| curing ratio | % | >80 | 93 | 93 | 93 | 91 | 90 | 88 | 85 |
| CTE | ppm/° C. | <70 | 47 | 45 | 42 | 37 | 37 | 34 | 31 |
| contact resistance | mΩ | <1.50 | 1.25 | 1.22 | 1.20 | 1.18 | 1.18 | 1.15 | 1.12 |
| insulation resistance | mΩ | >$10^{9-12}$ | $10^{12}$ | $10^{12}$ | $10^{12}$ | $10^{11}$ | $10^{10}$ | $10^{9}$ | $10^{8}$ |
| adhesive force | Kgf/cm2 | >30 | 34 | 35 | 38 | 41 | 41 | 44 | 45 |
| driving reliability |  |  | OK | OK | OK | OK | OK | OK | NG (short) |

As shown in Table 3, the coefficient of thermal expansion (CTE) is reduced due to a surface area increase and dispersibility improvement by the Ag conductive particles such that the stress concentrated in the interface is dispersed.

The adhesive films of Examples 6 to 8, where the weight % of Ag conductive particle is smaller than 1.0, meet the requirement in all of the curing time, the viscosity, the curing ratio, the CTE and the contact resistance.

However, the adhesive films of Examples 9 to 11 and Comparative Example 6, where the weight % of Ag conductive particle is larger than 1.0, the viscosity and the curing time test results are rapidly increased. Particularly, there is an electrical short problem in the display device including the adhesive film of Comparative Example 6.

The adhesive film of the present invention may include the conductive particle of about 0.1 to 4.0 weight % to avoid the electrical short problem. To meet the requirements in the viscosity and the curing time, the adhesive film of the present invention may include the conductive particle of about 0.1 to 0.5 weight %.

As mentioned above, when the related art anisotropic conductive film is used, there is the electrical short problem in the adjacent pad electrodes because the conductive balls have too large size, i.e., several to several tens micrometers. However, the size of the conductive particles of the conductive film in the present invention is sufficient small, i.e., several to several tens nanometers, such that the electrical short problem can be prevented.

FIGS. 3A to 3D are cross-sectional views showing a bonding process of a drive IC to an array substrate according to the present invention.

Figure 3A:
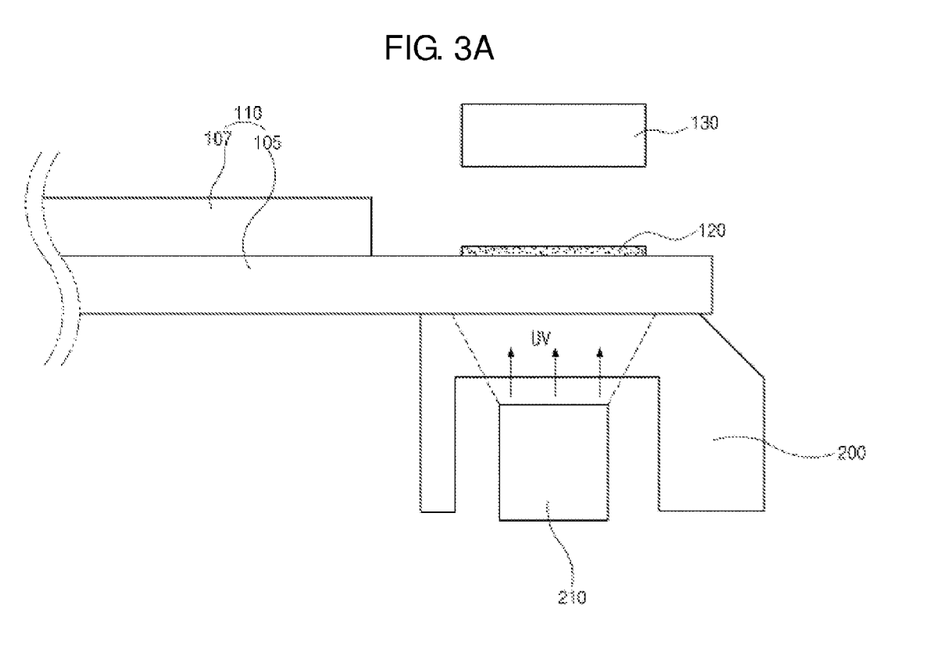
FIGS. 3A to 3D are cross-sectional views showing a bonding process of a drive IC to an array substrate according to the present invention.

As shown in FIG. 3A, an end of the display panel 110 including the array substrate 105 and the color filter substrate 107, where the (gate or data) pad electrode (not shown) is formed in the non-display region of the array substrate 105, is disposed on a support table 200, which is formed of a transparent material, e.g., glass or quartz, for transmitting the UV light, and the adhesive material for electrical connection of the present invention is coated on the pad electrode to form an adhesive film 120.

As explained with Table 3, the adhesive material has good viscosity and dispersibility such that the adhesive film 120 has an uniform thickness. In this instance, a size of the adhesive film 120 is larger than that of the pad electrode.

Next, the drive IC 130 is disposed over the adhesive film 120 and moved to contact the adhesive film 120.

Next, the UV light is irradiated through a rear surface of the array substrate 105 using an UV irradiating apparatus 210 under the support table 200 such that the ionic optical-curing agent and the optical curing accelerant in the adhesive film 120 are activated.

In this instance, a portion of the adhesive film 120 is shielded by the pad electrode (not shown) such that the UV light is not irradiated to the shielded portion of the adhesive film 120.

However, as mentioned above, since the adhesive film 120 includes the optical curing accelerant 122 (of FIG. 2) having the light diffusion property, the UV light is diffused into the shielded portion of the adhesive film 120 such that an entire region of the adhesive film 120 can be cured by the UV light.

Figure 3B:
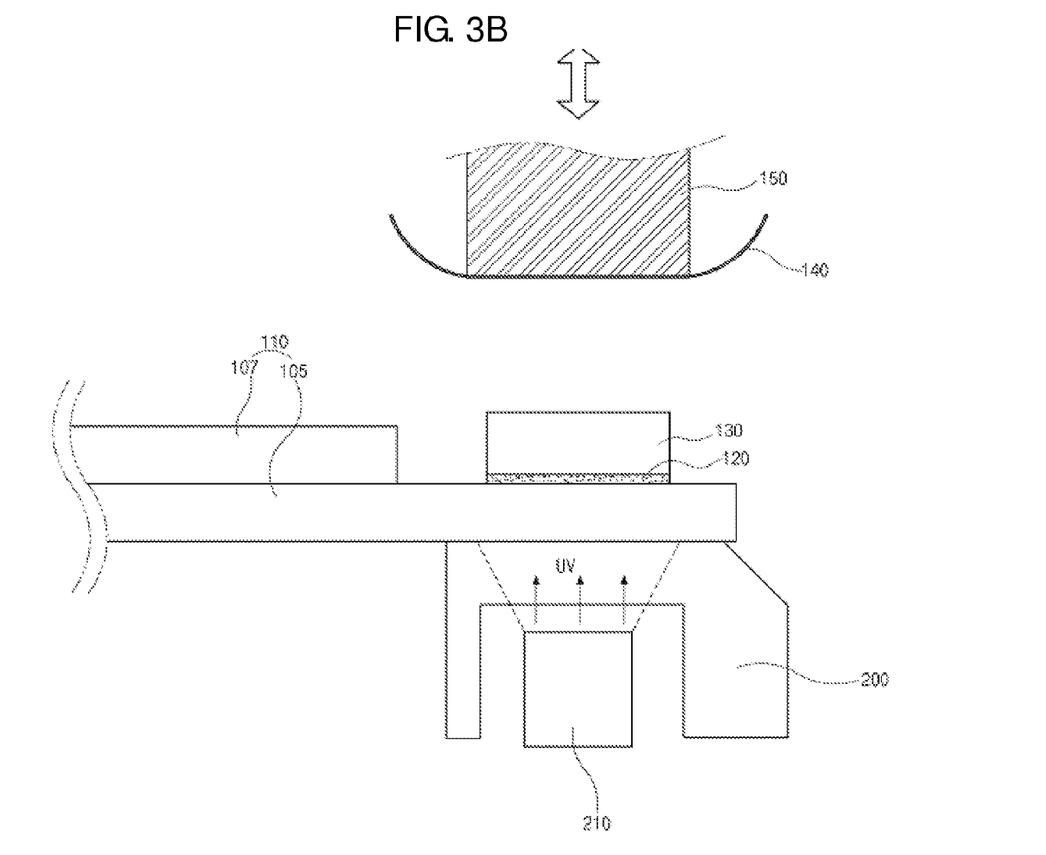
Figure 3C:
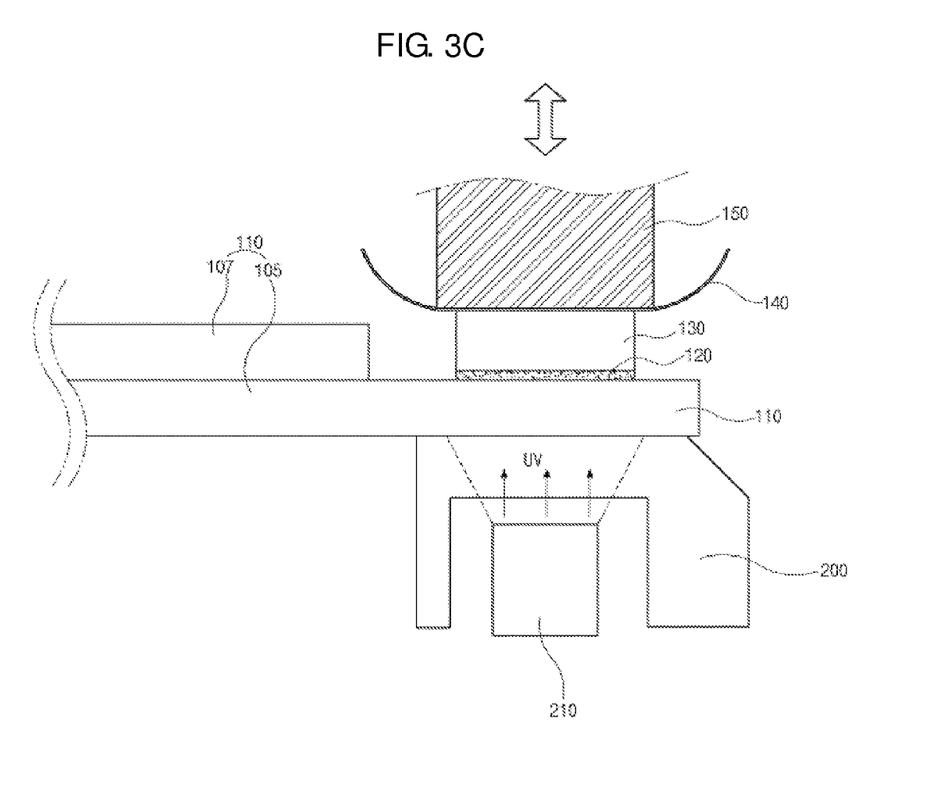
Figure 3D:
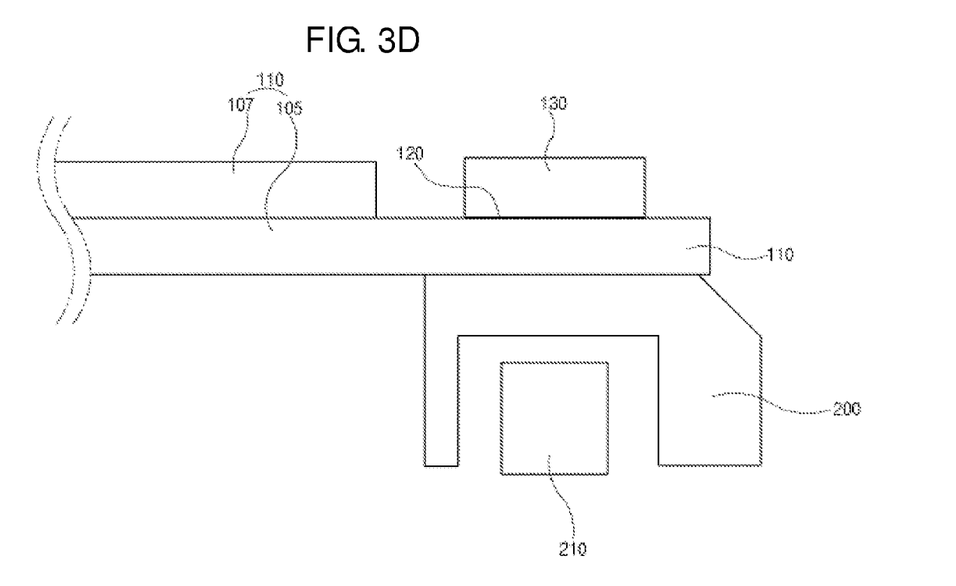

In addition, as shown in FIGS. 3B and 3C, a pressing unit 230 is disposed over the drive IC 130 and pressed the drive IC 130 under a room temperature (RT) such that an electrode 131 (of FIG. 2) in the drive IC 130 and the pad electrode 106 (of FIG. 2) in the array substrate 105 are electrically connected through the adhesive film 120. As a result, the drive IC 130 is bonded on the end of the array substrate 105. The pressing process may be simultaneously performed as the UV irradiation.

On the other hand, instead of the pressing unit 230, a thermal pressing unit such as a heating bar may be used. The adhesive film 120 is thermally pressed by a heat of 110 to 130° C. such that the adhesive film 120 is optically and thermally cured. In this instance, the shielded portion of the adhesive film 120 is securely cured by the thermal-curing process.

The related art anisotropic conductive film should be cured by heating in the temperature of 150 to 190° C. However, in the present invention, the adhesive film 120 is cured by both the UV light and the heat, the thermal curing process is performed using the thermal pressing unit with a relatively low temperature of about 110 to 130° C. As a result, damages or deformation on the adhesive film 120, the drive IC 130 or the polarization plate (not shown) can be prevented.

FIGS. 3A to 3D show the pressing or thermal pressing process is performed as or after the UV curing process. Alternatively, the pressing or thermal pressing process may be performed before the UV curing process.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An adhesive material for an electrical connection, comprising:
   a base resin;
   an ionic optical-curing agent;
   an optical curing accelerant; and
   a conductive particle having a size of several to several tens nanometers, wherein the adhesive material is cured by a UV light, and the UV light is diffused by the optical curing accelerant, and wherein a weight % summation of the base resin, the ionic optical-curing agent, the optical curing accelerant, and the conductive particle is 100% based on the total composition of the adhesive material.

2. The adhesive material according to claim 1, wherein the ionic optical-curing agent has a weight % of more than 0.01 and less than 10 with respect to a total amount of the adhesive material, and the optical curing accelerant has a weight % of more than 0.01 and less than 10 with respect to a total amount of the adhesive material, and wherein the conductive particle has a weight % of about 0.1 to 1 with respect to the total amount of the adhesive material, and the base resin has a weight % of a residual amount.

3. The adhesive material according to claim 2, wherein the adhesive material is further cured by a heat of about 110 to 130° C.

4. The material according to claim 2, wherein the base resin includes at least one of epoxy resin and acrylate resin, and the ionic optical-curing agent includes at least one of borate salt and iodine salt, and wherein the optical curing accelerant includes at least one of polystyrene (PS), polycarbonate (PC) and polyethyleneterephthalate (PET), and the conductive particle includes silver (Ag).

5. The material according to claim 4, wherein the epoxy resin includes naphthalene-based epoxy monomer, epoxy-acrylate monomer, bisphenol-A-based epoxy monomer, bisphenol-F-based epoxy monomer, cresol-based epoxy monomer and novolak-based epoxy monomer, and the acrylate resin includes 2-ethylhexylacrylate, tridecylmethacrylate, nonylphenolethoxylate monoacrylate, beta-carboxyethyl acrylate, isobornyl acrylate, tetrahydrofurfuryl acrylate, tetrahydrofurfuryl methacrylate, 4-butylcylcohexyl acrylate, dicyclopentenyl acrylate, dicycloentenyl oxyethyl acrylate, ethoxyethyl acrylate, and ethoxylated monoacrylate.

6. A display device, comprising:
a display panel including an array substrate and a color filter substrate;
a pad electrode in a non-display region of the array substrate;
an adhesive layer on the pad electrode and including:
a base resin;
an ionic optical-curing agent;
an optical curing accelerant; and
a conductive particle having a size of several to several tens nanometers, and
a drive IC on the adhesive layer and electrically connected to the pad electrode through the adhesive layer,
wherein the adhesive layer is cured by a UV light, and the UV light is diffused by the optical curing accelerant, and
wherein a weight % summation of the base resin, the ionic optical-curing agent, the optical curing accelerant, and the conductive particle is 100% based on the total composition of the adhesive layer.

7. The device according to claim 6, wherein ionic optical-curing agent has a weight % of more than 0.01 and less than 10 with respect to a total amount of the adhesive layer, the optical curing accelerant has a weight % of more than 0.01 and less than 10 with respect to a total amount of the adhesive layer, and wherein the conductive particle has a weight % of about 0.1 to 1 with respect to the total amount of the adhesive layer, and the base resin has a weight % of a residual amount.

8. The device according to claim 7, wherein the adhesive layer is further cured by a heat of about 110 to 130° C.

9. The device according to claim 7, wherein the base resin includes at least one of epoxy resin and acrylate resin, and the ionic optical-curing agent includes at least one of borate salt and iodine salt, and wherein the optical curing accelerant includes at least one of polystyrene (PS), polycarbonate (PC) and polyethyleneterephthalate (PET), and the conductive particle includes silver (Ag).

10. The device according to claim 9, wherein the epoxy resin includes naphthalene-based epoxy monomer, epoxy-acrylate monomer, bisphenol-A-based epoxy monomer, bisphenol-F-based epoxy monomer, cresol-based epoxy monomer and novolak-based epoxy monomer, and the acrylate resin includes 2-ethylhexylacrylate, tridecylmethacrylate, nonylphenolethoxylate monoacrylate, beta-carboxyethyl acrylate, isobornyl acrylate, tetrahydrofurfuryl acrylate, tetrahydrofurfuryl methacrylate, 4-butylcylcohexyl acrylate, dicyclopentenyl acrylate, dicycloentenyl oxyethyl acrylate, ethoxyethyl acrylate, and ethoxylated monoacrylate.

11. A method of fabricating a display device, comprising:
forming a display panel including an array substrate and a color filter substrate, wherein a pad electrode is formed in a non-display region of the array substrate;
forming an adhesive layer on the pad electrode by coating an adhesive material, the adhesive material including:
a base resin;
an ionic optical-curing agent;
an optical curing accelerant; and
a conductive particle having a size of several to several tens nanometers,
disposing a drive IC on the adhesive layer;
irradiating a UV light onto the adhesive layer through a rear surface of the array substrate; and
pressing the drive IC toward the adhesive layer,
wherein the adhesive layer is cured by a UV light, and the UV light is diffused by the optical curing accelerant,
wherein the UV light is diffused by the optical curing accelerant into a portion of the adhesive layer shielded by the pad electrode, and
wherein a weight % summation of the base resin, the ionic optical-curing agent, the optical curing accelerant, and the conductive particle is 100% based on the total composition of the adhesive material.

12. The method according to claim 11, wherein the step of pressing the drive IC toward the adhesive layer is performed at room temperature.

13. The method according to claim 11, wherein the step of pressing the drive IC toward the adhesive layer is performed with a heat of 110 to 130° C.

14. The method according to claim 11, wherein the step of pressing the drive IC toward the adhesive layer is performed at the same time as the step of irradiating the UV light or before or after the step of irradiating the UV light.

15. The method according to claim 11, wherein ionic optical-curing agent has a weight % of more than 0.01 and less than 10 with respect to a total amount of the adhesive material, the optical curing accelerant has a weight % of more than 0.01 and less than 10 with respect to a total amount of the adhesive material, and wherein the conductive particle has a weight % of about 0.1 to 1 with respect to the total amount of the adhesive material, and the base resin has a weight % of a residual amount.

16. The method according to claim 15, wherein the adhesive layer is further cured by a heat of about 110 to 130° C.

17. The method according to claim 15, wherein the base resin includes at least one of epoxy resin and acrylate resin, and the ionic optical-curing agent includes at least one of borate salt and iodine salt, and wherein the optical curing accelerant includes at least one of polystyrene (PS), polycarbonate (PC) and polyethyleneterephthalate (PET), and the conductive particle includes silver (Ag).

18. The method according to claim 17, wherein the epoxy resin includes naphthalene-based epoxy monomer, epoxy-acrylate monomer, bisphenol-A-based epoxy monomer, bisphenol-F-based epoxy monomer, cresol-based epoxy monomer and novolak-based epoxy monomer, and the acrylate resin includes 2-ethylhexylacrylate, tridecylmethacrylate, nonylphenolethoxylate monoacrylate, beta-carboxyethyl acrylate, isobornyl acrylate, tetrahydrofurfuryl acrylate, tetrahydrofurfuryl methacrylate, 4-butylcylcohexyl acrylate, dicyclopentenyl acrylate, dicycloentenyl oxyethyl acrylate, ethoxyethyl acrylate, and ethoxylated monoacrylate.

* * * * *